United States Patent

Komoto et al.

[11] Patent Number: 5,916,675
[45] Date of Patent: Jun. 29, 1999

[54] POLYCARBODIIMIDE RESIN-CONTAINING ADHESIVE AND FLEXIBLE PRINTED CIRCUIT BOARD

[75] Inventors: Yasuyoshi Komoto; Akira Hayashida; Michio Aizawa, all of Tokyo; Hitoshi Arai, Ibaraki-ken; Ken Yahata, Tokyo, all of Japan

[73] Assignee: Shin-Etsu Chemical Co., Ltd., Tokyo, Japan

[21] Appl. No.: 08/873,947

[22] Filed: Jun. 12, 1997

[30] Foreign Application Priority Data

Jun. 14, 1996 [JP] Japan ................................. 8-153570

[51] Int. Cl.⁶ ....................................................... B32B 7/12
[52] U.S. Cl. ................................. 428/355 R; 428/425.8; 428/423.1; 428/355 N; 428/355 RA; 156/289; 156/330; 156/331.7
[58] Field of Search ...................... 528/44, 73; 525/528; 428/425.8, 423.1, 355 N, 355 RA, 355 P; 156/289, 330, 331.7; 564/252

[56] References Cited

U.S. PATENT DOCUMENTS

| 2,941,966 | 6/1960 | Campbell | 564/252 |
| 3,990,603 | 11/1976 | Brochman | 220/260 |
| 4,118,536 | 10/1978 | Beardsley et al. | 428/413 |
| 4,980,096 | 12/1990 | Cian et al. | 548/494 |
| 5,679,730 | 10/1997 | Amano et al. | 525/528 |

FOREIGN PATENT DOCUMENTS

| 0557906 | 9/1995 | European Pat. Off. . |
| 5989380 | 11/1982 | Japan . |
| 60079079 | 10/1983 | Japan . |
| 60260669 | 6/1984 | Japan . |
| 4036369 | 6/1990 | Japan . |

OTHER PUBLICATIONS

J. Org. Chem., 28, p. 2069 (1963) "High Polymers Containing the Carbodiimide Repeat Unit ".

*Primary Examiner*—Rachel Gorr
*Attorney, Agent, or Firm*—McAulay Nissen Goldberg Kiel & Hand, LLP

[57] ABSTRACT

Described is an adhesive containing a polycarbodiimide resin having repeating units represented by the following formula:

$$\text{\textonehalf}(R-N=C=N)_{\overline{n}}$$

wherein R is a divalent hydrocarbon group and n is an integer of 5 to 250, and also described is a flexible printed circuit board and a coverlay film fabricated using the above-described polycarbodiimide resin-containing adhesive.

4 Claims, 3 Drawing Sheets

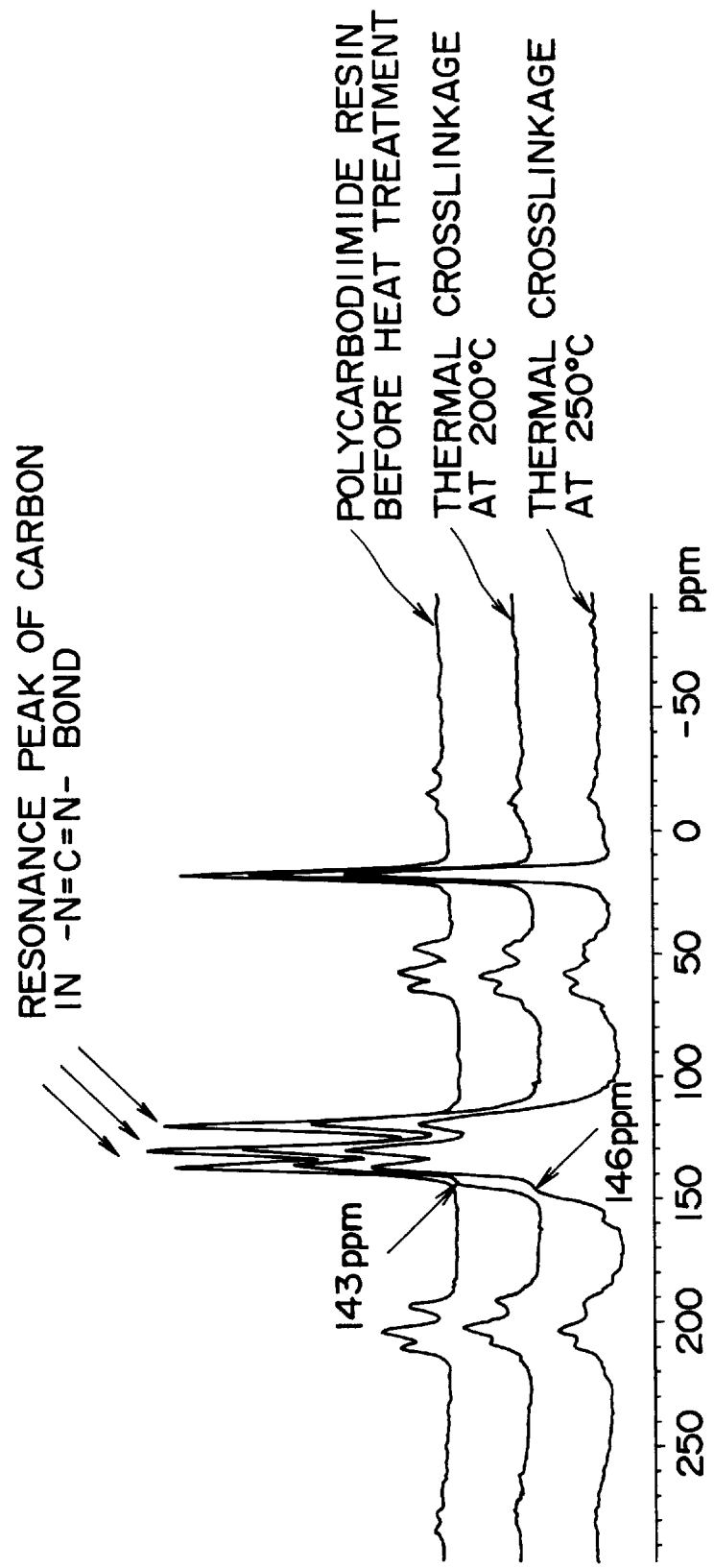

POLYCARBODIIMIDE RESIN-CONTAINING ADHESIVE AND FLEXIBLE PRINTED CIRCUIT BOARD

BACKGROUND OF THE INVENTION

1. Field of the Invention

This invention relates to a polycarbodiimide resin-containing adhesive and also to a flexible printed circuit board fabricated using the polycarbodiimide resin-containing adhesive and a process for the fabrication of the printed circuit board.

2. Description of the Related Art

Low molecular carbodiimides such as dicyclohexylcarbodiimide, diisopropylcarbodiimide and di-p-toluoylcarbodiimide are highly reactive reagents generally used as a reagent for dehydration and condensation. These low molecular carbodiimides are used in the synthesis of esters, peptides or the like.

A polycarbodiimide having plural carbodiimide bonds in its molecule is generally prepared by the decarboxylation condensation of a diisocyanate in a proper solvent in the presence of a carbodiimidation reagent.

It is disclosed in J. Org. Chem., 28, 2069(1963) and U.S. Pat. No. 2,941,966 that the polycarbodiimide obtained from an aromatic diisocyanate is particularly useful as a heat-resistant macromolecule.

Flexible printed circuit boards (FPC) have so far been fabricated using an adhesive such as an epoxy resin (Japanese Patent Provisional Publication Nos. 59-89380, 60-260669, 60-79079) or urethane resin between a copper foil and an aromatic polyimide film which has inherently inferior adhesiveness.

The flexible printed circuit boards fabricated using an adhesive such as epoxy resin or urethane resin are however accompanied with the problems that when such flexible printed circuit boards are exposed to high temperatures in the subsequent soldering step, there occurs blisters or peeling of the adhesive layer, or short outs occur at the interconnection owing to the plastic deformation of the adhesive layer.

With a view to overcoming such problems, polyimide base or polybenzimidazole base adhesives having excellent heat resistance have been developed. These polyimide or polybenzimidazole base adhesives are not always suited for the fabrication of a flexible printed circuit board, because polyimide or polybenzimidazole resins used for them are expensive, and a special high-boiling-point solvent contained in such adhesives requires severe adhesion conditions at high temperature and high pressure.

There is a report (Japanese Patent Provisional Publication No. 4-36369) on the preparation of a heat-resistant adhesive from a polycarbodiimide resin. That adhesive is aimed at the adhesion of not an organic material but an inorganic material. Furthermore, the report only includes the finding of adhesion performances at temperatures higher than 350° C. and it does not suggest that the adhesive is suitable for the fabrication of a flexible printed circuit board.

In addition to the above-described adhesives, various adhesives such as those made of a fluorine resin, polyamide-imide resin, silicone resin, epoxy-novolac resin, epoxy-acrylic resin, nitrile-rubber phenol resin or polyester resin have been developed. None of them, however, satisfy both heat resistance and high-temperature adhesive strength.

In addition, in recent years, fine patterning and multi-layerization of interconnection circuits in a flexible printed circuit board are under way, as electronic devices become smaller, lighter and high-performanced. Accordingly, there is a demand for an improvement in the heat resistance and adhesion properties of an adhesive to be employed so as to avoid blisters and peeling even if the final product is subjected to various high-temperature treatment steps, and prevent curling or plastic deformation of an adhesive layer from occurring. Curling and deformation are known to cause such problems as short circuiting of interconnections.

SUMMARY OF THE INVENTION

An object of the present invention is therefore to provide a carbodiimide-resin-containing adhesive having excellent heat resistance, adhesive strength and good processing properties, and also a flexible printed circuit board and a coverlay film fabricated using the adhesive and a process for the fabrication of the printed circuit board and the coverlay film.

With a view to attaining the above object, the present inventors have developed a flexible printed circuit board fabricated by adhering a metal foil such as a copper foil with a heat-resistant resin film such as a polyimide resin film by using as an adhesive a polycarbodiimide resin excellent in both adhesion properties and heat resistance; and a process for the fabrication of the board.

Also, the present inventors have developed a coverlay film comprising an adhesive of the present invention, a release agent and a heat-resistant resin film for protection of a circuit side of a flexible printed circuit board.

The present invention therefore provides an adhesive which contains a polycarbodiimide resin having repeating units represented by the following formula:

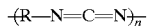

wherein R is a divalent hydrocarbon group and n is an integer of 5 to 250.

The present invention also provides a flexible printed circuit board and a coverlay film fabricated using the above-described polycarbodiimide resin-containing adhesive.

For the adhesion of the flexible printed circuit board and the coverlay film of the present invention, a mixture of the above-described polycarbodiimide resin and a general-purpose adhesive can be used as an adhesive. As the general-purpose adhesive for the flexible printed circuit board, an epoxy resin is preferred.

The polycarbodiimide resin-containing adhesive of the present invention makes it possible to provide a flexible printed circuit board having a metal foil and a heat-resistant resin film adhered to each other through the adhesive.

The present invention also provides a process for the fabrication of a flexible printed circuit board having thermal history at 40 to 400° C. in any one of the steps from application of the adhesive to the post-treatment after adhesion (drying, adhesion and post-curing).

Incidentally, the term "thermal history" as used herein means thermal treatment performed in any one of the steps after the application of the adhesive, that is, drying, adhesion and post-curing steps.

In the above fabrication process, it is preferred to carry out the heat adhesion process so that the polycarbodiimide resin has a pronounced infrared absorption at 2,142 $cm^{-1}$ in the IR spectrum before the heat adhesion process and shows a new pronounced absorption at 1,630 to 1,685 $cm^{-1}$ after the heat adhesion.

In the above fabrication process, it is preferred to carry out the heat adhesion process so that the polycarbodiimide resin has $^{13}$C-NMR (CP-MAS) spectrum at 120 to 140 ppm before heat adhesion and the resin has a new specific resonance peak at 140 to 150 ppm thereafter.

In the fabrication process of the coverlay film, it is preferred to carry out the heat adhesion process so that the polycarbodiimide resin has the same pattern of an infrared absorption spectrum and $^{13}$C-NMR (CP-MAS) spectrum before and after the heat adhesion, respectively, as the resin in the fabrication process of the flexible printed circuit board.

According to the present invention, a flexible printed circuit board can be fabricated easily by using a polycarbodiimide resin capable of satisfying the high-level heat resistance and adhesive strength conditions and having good coating applicability, carrying out a series of steps, that is, application of an adhesive solution onto a heat-resistant-resin film or metal foil, drying, adhesion between the metal foil and the heat-resistant-resin film and curing of the adhesive layer, and then forming a circuit through etching.

Likewise, a coverlay film which has the high-level heat resistance and adhesive strength can be fabricated easily by using the polycarbodiimide resin.

In the present invention, the use of a carbodiimide-resin-containing heat-resistant adhesive according to the present invention makes it possible to provide, in the fabrication of a flexible printed circuit board, a final product which has stable quality, more specifically, a final product which is, even after various high-temperature treatment steps, free from blisters or peeling, or remarkable curling or plastic deformation of the adhesive layer resulting in a short circuit of interconnection.

Likewise, it is possible to provide easily a coverlay film which has high quality in the heat resistance and adhesion properties of an adhesive to be employed.

BRIEF DESCRIPTION OF THE DRAWINGS

FIG. 3 is a graph illustrating $^{13}$C-NMR spectra of the polycarbodiimide resins obtained in Examples 2 and 3.

DETAILED DESCRIPTION OF THE PREFERRED EMBODIMENTS

Figure 1:
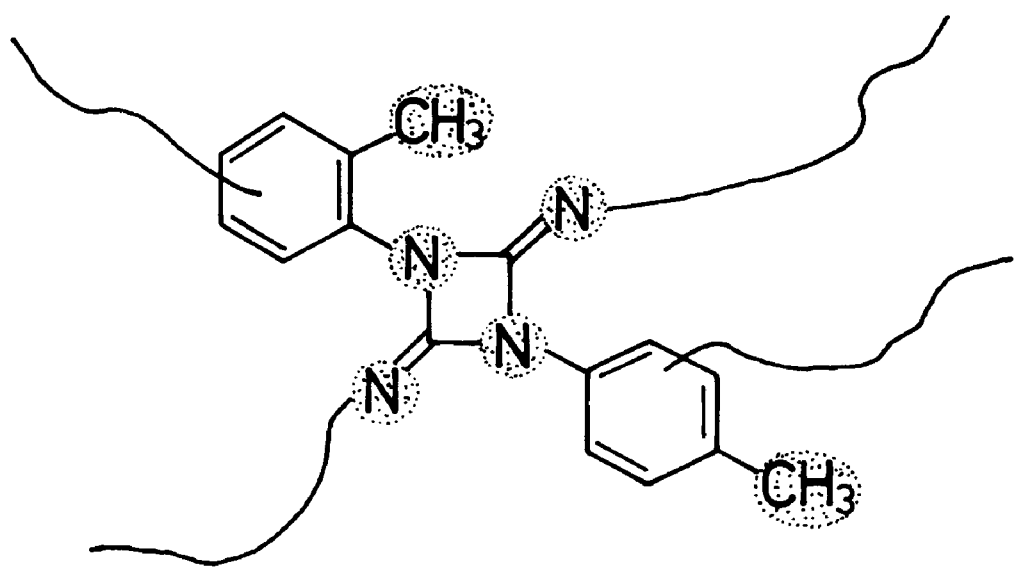
FIG. 1 is a schematic view of a polycarbodiimide in Example 2, wherein self-crosslinking of carbodiimide bonds have proceeded by heating to form a four-membered ring.

The polycarbodiimide resin employed in the present invention is prepared by decarboxylation condensation of an organic diisocyanate in the presence of a carbodiimidation catalyst.

Organic diisocyanate

Examples of the organic diisocyanate usable as a raw material compound for the polycarbodiimide resin employed in the present invention include aromatic diisocyanates such as 2,4-toluene diisocyanate, 2,6-toluene diisocyanate and 4,4'-diphenylmethane diisocyanate and aliphatic diisocyanates such as isophorone diisocyanate and 2,4-cyclohexylene diisocyanate. The organic diisocyanates can be used either singly or in combination.

The polycarbodiimide resin employed in the present invention is represented by the following formula:

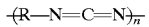

In the above formula, R is a divalent hydrocarbon group and the residue of the various organic diisocyanate exemplified above correspond to it. Preferably, R is an aromatic or aliphatic hydrocarbon group. Examples of R include 2,4-toluene, 2,6-toluene, naphthalene, xylene, xylylene, methylenebisdiphenylene, isophorone, and 2,4-cyclohexylene. Besides, n is an integer of 5 to 250.

Carbodiimidation Catalyst

No particular limitation is placed on the type of the carbodiimidation catalyst used for the preparation of the polycarbodilmide of the present invention insofar as it serves to accelerate the polymerization reaction promptly, contains neither unreacted organic diisocyanates nor by-products and is highly stable by itself. The compounds which meet these requirements include, for example, cyclic phosphine oxides such as 1-phenyl-2-phospholen-1-oxide, 3-methyl-2-phospholen-1-oxide or 3-methyl-1-phenyl-3-phospholen-1-oxide.

Solvent

In the present invention, the polymerization reaction of an organic diisocyanate in the present invention is effected in an aromatic hydrocarbon base solvent (Japanese Patent Application No. 7-140144 or an aromatic hydrogenated compound (Japanese Patent Application No. 7-140145 disclosed previously by the present inventors, or in an ether base solvent. Examples of the aromatic hydrocarbon base solvent include toluene and xylene, those of the aromatic hydrogenated compound include chlorobenzene, o-dichlorobenzene and p-chlorotoluene, and those of the ether base solvent include 1,4-dioxane, 1,3-dioxane and dioxolan.

Preparation Conditions

<Number-average molecular weight>

The polymerization degree of the polycarbodiimide, "n" is desired to be at least 5 but not higher than 250. If the polymerization degree is lower than 5, low viscosity and high fluidity prevents uniform coating. Besides, the crosslinking reaction proceeds very slowly so that such a polymerization degree is not preferred from the industrial point of view. The polymerization degree n of 30 or more is more preferred.

Concerning the upper limit, the polymerization degree is desired to be 80 or less when the polymerization reaction is effected in an aromatic hydrocarbon base solvent such as toluene in the preparation process of a polycarbodiimide. When the polymerization reaction is conducted in an aromatic hydrogenated compound such as chlorobenzene or an ether base solvent such as 1,4-dioxane, on the other hand, the polymerization degree is desired to be 250 or less.

In case of any polymerization degree more than 80 in an aromatic hydrocarbon base solvent, or more than 250 in an aromatic halogenated compound or ether base solvent, the polycarbodiimide solution becomes viscous and with a further increase in the polymerization degree, the solution gelates, which is inconvenient for its transportation or for the purification step such as filtration. Such a high polymerization degree also causes unevenness in the adhesion of a metal foil with a heat-resistant-resin film so that it is not preferred for the fabrication of a flexible printed circuit board. The number-average molecular weight, though depending on the kind of the diisocyanate residue, is generally 650 to 30,000, with 5,000 to 30,000 being more preferred.

In order to overcome such problems, it is possible to use a polycarbodiimide resin having a molecular weight controlled by blocking the terminal NCO residue with at least one monoisocyanate or a reagent, such as alcohol, readily reactive with an isocyanate group. In case that the polycarbodiimide resin has the terminal NCO residue, especially the polymerization degree is low, $CO_2$ gas generates when the polycarbodiimide resin is heated, which might cause mixing of foam, blisters or peeling. Therefore, it is preferred to block the terminal with the above reagent. Examples of the monoisocyanate usable for such a purpose include phenyl isocyanate, (o, m, p)-tolyl isocyanate, dimethylphenyl isocyanate and cyclohexyl isocyanate. Examples of the reagent readily reactive with an isocyanate group include alcohol, primary or secondary amine and mercaptan.

<Conditions of reaction temperature, catalyst and concentration>

The molecular weight can be controlled within the above-described range according to the preparation conditions such as a concentration of an organic diisocyanate in a solvent, a ratio of the catalyst to the organic diisocyanate, reaction temperature and reaction time.

The concentration of the organic diisocyanate in a solvent is preferably 1 to 20 w/w %, more preferably 2 to 10 w/w % from the viewpoint of forming property. Any concentrations lower than 1 w/w % are not economical, while any concentrations higher than 20 w/w % raise the reaction rate, which makes it difficult to control the molecular weight and increases a change in the molecular weight during storage. Concentrations outside the above range are therefore not preferred.

Accordingly, the amount of the catalyst, temperature and reaction time at the time when the concentration of the organic diisocyanate is 20 w/w % or lower are factors for the adjustment of the molecular weight.

The amount of the catalyst preferably falls within a range of from 0.05 to 0.2 mole %. The reaction temperature is preferred to fall within a range of from 100 to 150° C. When the amount of the catalyst and reaction temperature exceed the above ranges, respectively, the reaction rate increases, which makes it difficult to control the molecular weight. Those lower than the above range are, on the other hand, not economical because it takes more time to complete the reaction. When the reaction conditions fall within the above ranges, the reaction can be completed within 1 to 4 hours. Incidentally, it is suited to use gel permeation chromatography for the measurement of the number-average molecular weight.

Examples of the general-purpose adhesive used as a mixture with the polycarbodiimide resin include epoxy resin, phenol resin, melamine resin, urea resin, acrylic resin, polyester resin and acrylonitrile-butadiene rubber (NBR). One or more than one of these adhesives can be added to the polycarbodiimide resin. As described above, an epoxy resin is preferred among these general-purpose adhesives. It is also possible to add a curing agent, curing accelerator, inorganic filler or the like as needed.

Incidentally, it is preferred that the polycarbodiimide resin is contained in the adhesive composition in an amount of 5 to 100 wt %.

<Conditions for the fabrication of a flexible printed circuit board>

Adhesion Conditions

No particular limitation is placed on the manner of the adhesion using the adhesive of the present invention. The adhesion can be carried out either by applying the adhesive onto a metal foil and then stacking the resulting metal foil onto a heat-resistant film with the adhesive applied side therebetween, alternatively by applying the adhesive onto the heat-resistant film and then stacking the resulting heat-resistant film onto the metal foil with the adhesive applied side therebetween.

Examples of the heat-resistant resin film usable in the present invention include polyimide film, polyester film, polyparabanic acid film, polyether ether ketone film, polyphenylene sulfide film and amide film. Among them, a polyimide film is used preferably. The thickness of the film generally falls within a range of from 12.5 to 125 $\mu$m but a film with a proper thickness is used as needed. It is also possible to subject one side or both sides of the film to surface treatment such as low-temperature plasma treatment, corona discharge treatment, sandblasting or the like.

Examples of the metal foil include copper foils (electrolytic copper foil, rolled copper foil), aluminum foil, tungsten copper foil and iron foil, with a copper foil being preferred. Incidentally, the thickness of the metal foil generally falls within a range of from 18 to 70 $\mu$m but the metal foil with a proper thickness can be used as needed.

The solution of the polycarbodiimide resin obtained by polymerization or a mixture of the polycarbodiimide resin solution and a general-purpose adhesive is applied onto a metal foil or a heat-resistant resin film to a predetermined thickness by a commonly-employed coating method such as roll coater, comma coater, coating applicator or the like, dried and then subjected to solvent removal. It is recommended to apply the adhesive to give a thickness of 1 to 35 $\mu$m, preferably 10 to 25 $\mu$m when dried.

The adhesive-applied heat-resistant-resin film and the metal foil (or the adhesive-applied metal foil and the heat-resistant film) are subjected to contact bonding under heat and to, as needed, postcuring, whereby a flexible printed circuit board can be fabricated. It is desired that after application onto the film or foil, the adhesive is dried under heat at the temperature of 40 to 200° C. for 1 to 300 minutes and it is also possible to carry out drying under reduced pressure as needed.

Contact bonding for the adhesion of the heat-resistant-resin film with the metal foil can be carried out either by a continuous method using roll laminators or a batch method using a pressing machine. In the former case, the temperature of from 40 to 400° C., a linear pressure of from 10 to 30 kg/cm and a velocity of from 1 to 10 m/min are particularly preferred, while in the latter case, the temperature of from 40 to 400° C., a pressure of from 5 to 80 kg/cm and time of from 1 to 120 minutes are particularly preferred. The contact bonding method is determined as needed after various conditions are taken into consideration.

As postcuring conditions, temperature at 100 to 400° C. and time for 1 to 60 minutes are particularly preferred.

In the fabrication process of a flexible printed circuit board according to the present invention, a thermal history at 40 to 400° C. for at least one minute, preferably 10 to 120 minutes is required during any one of the steps until the fabrication of a flexible printed circuit board is completed. As temperature conditions, heating at 100 to 400° C. is preferred, with heating at 200 to 400° C. being more preferred. Any temperatures not higher than 40° C. lead to inferior soldering resistance, while any temperatures exceeding 400° C. cause decomposition of the adhesive. Temperatures outside the above range are therefore not preferred.

In the present invention, a thermal history within a predetermined range during any one of the steps for the fabrication of a flexible printed circuit board causes self crosslinkage of carbodiimide bonds, which is not available before heating, and brings about higher heat resistance and mechanical strength. The progress of the crosslinkage of the carbodiimide bonds can be confirmed by infrared absorption spectrum and NMR measurement. Described specifically, as a result of the measurement by infrared absorption spectrum, the polycarbodiimide resin solution before heating, which has not yet caused self-crosslinkage, only has a special absorption of the carbodiimide bond at 2,142 cm$^{-1}$, while the polycarbodiimide resin solution which has formed self-crosslinkage by heating has an absorption at 1,630 to 1,685 cm$^{-1}$. As a result of $^{13}$C-NMR measurement, the polycarbodiimide resin solution forming a self-crosslinkage has a signal at about 140 to 150 ppm.

A flexible printed circuit board of the present invention can be formed a circuit through etching to produce a circuit board.

<Conditions for the fabrication of a coverlay film>

The present invention is applicable to a fabrication of a coverlay film which protects a circuit side of a flexible printed circuit board in the similar manner as the flexible printed circuit board described above.

The process of the fabrication of the coverlay film is as follows. A pretreated adhesive solution is coated on a heat-resistant film using reverse roll coater, comma coater, coating applicator or the like to give a thickness of 4 to 75 μm when dried. The resulting film is passed though an inline dryer and removed the solvent in the adhesive under heat at 40 to 200° C. for 1 to 300 minutes, thereby the adhesive is semi-cured. The adhesive-coated side of the film and a release agent are subjected to contact bonding at a linear pressure of 0.2 to 20 kg/cm, at the temperature of 40 to 200° C. using heated rolls, thereby a coverlay film is obtained. In this case, the pressure bonding between the film and the release agent can also be done using a press. The same heat resistant films as ones used in the fabrication of the flexible printed circuit board can be used. The thickness of the heat resistant film generally falls within a range of from 12.5 to 125 μm but a film with a proper thickness is used as needed. It is also possible to subject one side or both sides of the film to surface treatment such as low-temperature plasma treatment, corona discharge treatment, sandblasting or the like.

Examples of the release agent include polyethylene film, polypropylene film, TPX film, polyethylene film with silicone release agent, polypropylene with silicone release agent, polyethylene-resin coated paper, polypropylene-resin coated paper and so on. The film or paper with a suitable thickness can be used in accordance with necessity.

The coverlay film including semi-cured adhesive is peeled off from the release agent and is subjected to contact bonding with a circuit side of the flexible printed circuit board using heating rolls such as roll laminators. The pressure bonding may also be performed using a press. The heating conditions at the temperature of 40 to 400° C., at a linear pressure of 5 to 30 kg/cm and a velocity of 1 to 10 m/min are preferred. The semi-cured adhesive on the coverlay film is completely cured under such conditions. The pressure bonding may also be performed using a press. The cured adhesive on the coverlay film shows infrared adsorption at 1,630 to 1,685 cm$^{-1}$, and as a result of $^{13}$C-NMR measurement, the cured adhesive has a new peak at about 140 to 150 ppm.

In accordance with the above-described conditions, the heat-resistant adhesive of the present invention containing the polycarbodiimide resin can be used suitably for the fabrication of a flexible printed circuit board and a coverlay film.

The present invention will hereinafter be described in detail by the following Examples. It should however be borne in mind that scope of the present invention will not be limited to or by these Examples.

EXAMPLE 1

<Preparation of a solution composition of a heat-resistant adhesive>

In a four-necked 100-ml flask, 5.40 g of toluene diisocyanate containing 2,4-toluene diisocyanate and 2,6-toluene diisocyanate at a ratio of 80:20 (which will hereinafter be abbreviated as "TDI-80") and 48.5 ml of toluene were charged, followed by the addition of 12.4 mg of 3-methyl-1-phenyl-3-phospholen-1-oxide (which will hereinafter be abbreviated as "phospholene oxide") as a carbodiimidation catalyst. The resulting mixture was reacted for 3 hours in a nitrogen gas atmosphere, while being stirred under reflux.

After the completion of the reaction, strong absorption of a carbodiimide bond was recognized at 2,142 cm$^{-1}$. It was also confirmed that the polycarbodiimide solution so obtained contained neither the raw material organic diisocyanate nor byproduct.

As a result of gel permeation chromatography (which will hereinafter be abbreviated as "GPC") of the polycarbodiimide solution conducted after the completion of the reaction, it was found that the number-average molecular weight (which will hereinafter be abbreviated as "Mn") was 6,980 Da. The polymerization degree in regard to carbodiimide, n, was 54. That polycarbodiimide solution was employed as a heat resistant resin adhesive.

<Fabrication of a laminate of a metal foil and a heat resistant resin film by using the heat-resistant resin adhesive>

The solution composition of the above-described heat-resistant resin adhesive was coated onto an aromatic polyimide film ("Kapton", trade mark; product of Du Pont-Toray Co., Ltd., 25 μm thick) by using an applicator. The coated layer was dried under heating at 40° C. for 4 hours in vacuo, whereby a polycarbodiimide resin layer (uncured but dried layer) of about 10 μm thick was formed on the polyimide film. Onto the polyimide film having the resin layer, a rolled copper foil ("BHN-02T", trade name; product of Japan Energy Co., Ltd.) of 35 μm thick was stacked with the resin layer therebetween and they were allowed to pass through laminate rolls heated to 100° C. under pressure, whereby thermal contact bonding was effected. The heat resistant resin was cured by postcuring at 200° C. for 5 minutes, whereby a laminate was fabricated.

As a result of measuring the peel strength in accordance with JIS C6471 (to peel a circuit of 1 mm width formed on a substrate from the copper side in a vertical direction at a rate of 50 mm/min.), the laminate so obtained had a peel strength of 1.34 kg/cm. As a result of the measurement of soldering-heat resistance in accordance with JIS C6471 (to visually confirm blisters and peeling of a sample of 25 mm square floated on a flow soldering for 30 seconds), neither blisters nor peeling was recognized until 340° C.

EXAMPLE 2

<Preparation of a solution composition of a heat-resistant adhesive>

In a four-necked 100-ml flask, 5.122 g of TDI-80 and 48 ml of toluene were charged, followed by the addition of 14.76 mg of phospholene oxide as a carbodiimidation catalyst. To the resulting mixture, 0.189 g of phenyl isocyanate was added in order to block the terminal NCO residue. The resulting mixture was reacted for 4 hours in a nitrogen gas atmosphere, while being stirred under reflux. In the infrared absorption spectrum after the completion of the reaction, strong absorption of a carbodiimide bond was recognized at 2,142 cm$^{-1}$. It was also confirmed that the polycarbodiimide solution so obtained contained neither the raw material organic diisocyanate nor byproduct.

As a result of GPC analysis of the polycarbodiimide solution conducted after the completion of the reaction, it was found that Mn was 5,520 Da. The polymerization degree, n, was 42. That polycarbodiimide solution was employed as a heat-resistant resin adhesive.

<Fabrication of a laminate of a metal foil and a heat resistant resin film by using a heat-resistant resin adhesive>

The solution composition of the above-described heat-resistant resin adhesive was coated onto an aromatic polyimide film ("Kapton", trade mark; product of Du Pont-Toray Co., Ltd., 25 μm thick) by using an applicator. The coated layer was dried under heating at 100° C. for 10 minutes, whereby a polycarbodiimide resin layer (uncured but dried layer) of about 10 μm thick was formed on the polyimide film. Onto the polyimide film having the resin layer, a rolled copper foil ("BHN-02T", trade name; product of Japan Energy Co., Ltd.) of 35 μm thick was stacked with the resin layer therebetween. At the temperature of 200° C. and the pressure of 20 kg/cm², they were subjected to thermal contact bonding for 10 minutes by a pressing machine, whereby the heat-resistant resin was cured and a laminate was fabricated.

As a result of the measurement in accordance with JIS C6471, the laminate so obtained had a peel strength of 1.54 kg/cm. The soldering-heat resistance was also measured in accordance with JIS C6471. As a result, neither blisters nor peeling was recognized until 340° C.

Figure 2:
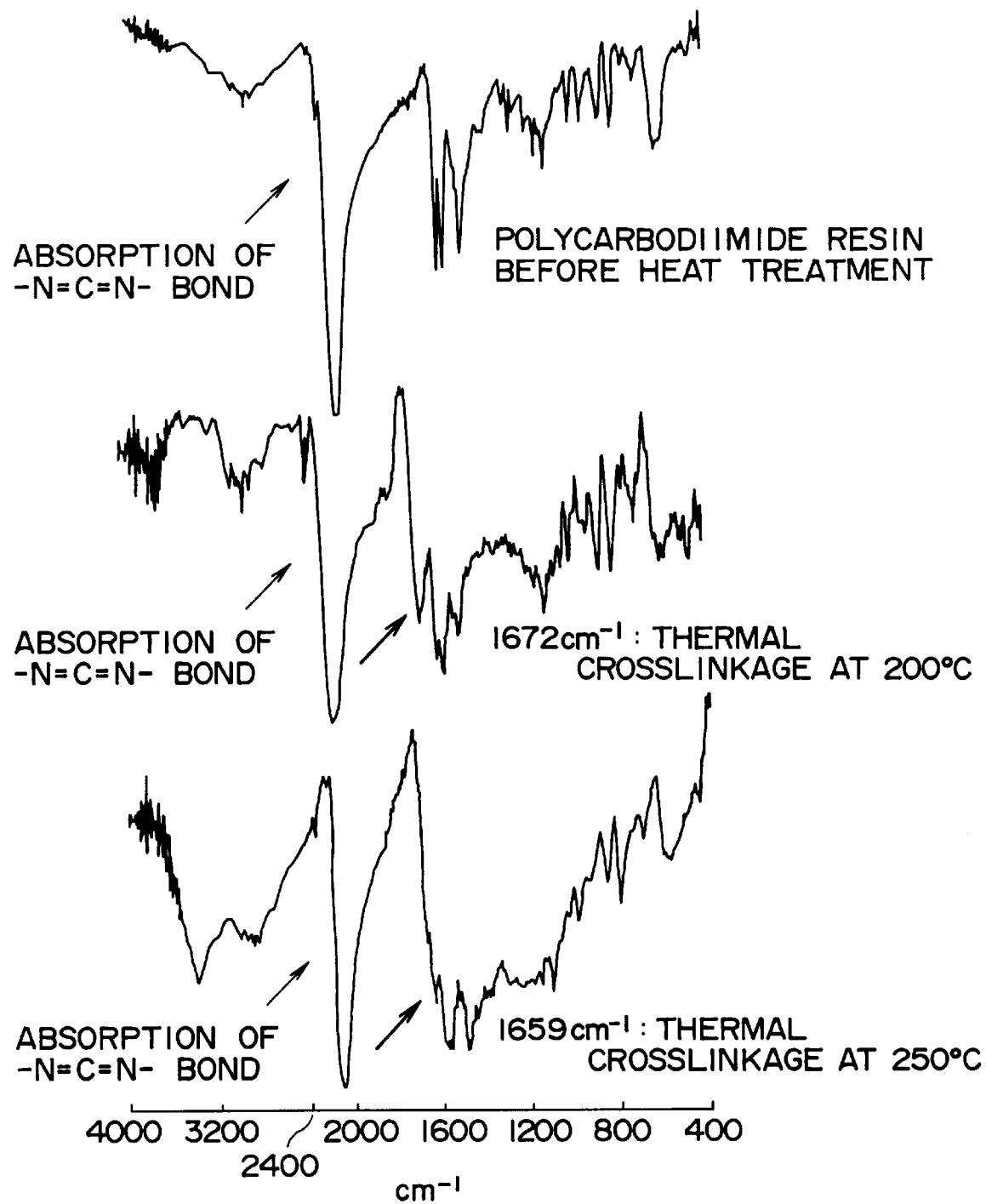
FIG. 2 is a graph illustrating infrared absorption spectra of the polycarbodiimide resins obtained in Examples 2 and 3.

The self-crosslinkage of the carbodiimide bond formed by heating was confirmed by infrared absorption spectrum and $^{13}$C-NMR measurement. Heating under the above-described conditions accelerates the thermal crosslinkage of the carbodiimide bonds, resulting in the formation of a four-membered ring as shown in FIG. 1. The progress of the thermal crosslinkage of the carbodiimide bonds was confirmed by infrared absorption spectrum and $^{13}$C-NMR measurement. As a result, a specific absorption was recognized at 1,672 cm$^{-1}$ in the infrared absorption spectrum as shown in FIG. 2. As the result of $^{13}$C-NMR measurement by cross-polarized magic angle spinning (CP-MAS), a new signal was confirmed at 143 ppm, from which the formation of a four-membered ring was recognized.

EXAMPLE 3

<Fabrication of a laminate of a metal foil and a heat resistant resin film by using a heat-resistant resin adhesive>

The solution composition of a heat-resistant resin adhesive prepared in a similar manner to Example 2 was coated onto an aromatic polyimide film ("Kapton", trade mark; product of Du Pont-Toray Co., Ltd., 25 μm thick) by using an applicator. The coated layer was dried under heating at 40° C. for 4 hours in vacuo, whereby a polycarbodiimide resin layer (uncured but dried layer) of about 10 μm thick was formed on the polyimide film. Onto the polyimide film having the resin layer, a rolled copper foil ("BHN-02T", trade name; product of Japan Energy Co., Ltd.) of 35 μm thick was stacked with the resin layer therebetween and they were allowed to pass through laminate rolls heated to 150° C. under pressure, whereby thermal contact bonding was effected.

The heat-resistant resin was cured by postcuring at 250° C. for 10 minutes, whereby a laminate was fabricated.

As a result of the measurement in accordance with JIS C6471, the peel strength of the laminate so obtained was 1.47 kg/cm. The soldering-heat resistance was also measured in accordance with JIS C6471. As a result, neither blisters nor peeling was recognized until 340° C.

Heating at the temperature higher than that of Example 2 accelerates the thermal crosslinkage furthermore, resulting in the formation of a six-membered ring. As a result, a new absorption was recognized at 1,659 cm$^{-1}$ in the infrared absorption spectrum as shown in FIG. 2. As a result of $^{13}$C-NMR measurement by CP-MAS, a new signal was confirmed at 146 ppm.

EXAMPLE 4

<Preparation of a solution composition of a heat-resistant adhesive>

In a 100-ml four-necked flask, 5.123 g of TDI-80 and 48.2 ml of 1,4-dioxane were charged, followed by the addition of 14.77 mg of phospholene oxide as a carbodiimidation catalyst. To the resulting mixture, 0.187 g of phenyl isocyanate was added in order to block the terminal NCO residue. The resulting mixture was reacted for 4 hours in a nitrogen gas atmosphere, while being stirred under reflux. In the infrared absorption spectrum after the completion of the reaction, strong absorption of a carbodiimide bond was recognized at 2,142 cm$^{-1}$. It was also confirmed that the polycarbodiimide solution so obtained contained neither the raw material organic diisocyanate nor byproduct.

As a result of GPC analysis of the polycarbodiimide solution conducted after the completion of the reaction, it was found that Mn was 7,450 Da. The polymerization degree, n, was 57. That polycarbodiimide solution was employed as a heat-resistant resin adhesive.

<Fabrication of a laminate of a metal foil and a heat resistant resin film by using a heat-resistant resin adhesive>

The solution composition of the above-described heat-resistant resin adhesive was coated onto an aromatic polyimide film ("Kapton", trade mark; product of Du Pont-Toray Co., Ltd., 25 μm thick) by using an applicator. The coated layer was dried under heating at 120° C. for 5 minutes, whereby a polycarbodiimide resin layer (uncured but dried layer) of about 10 μm thick was formed on the polyimide film. Onto the polyimide film having the resin layer, a rolled copper foil ("BHN-02T", trade name; product of Japan Energy Co., Ltd.) of 35 μm thick was stacked with the resin layer therebetween. They were allowed to pass through laminate rolls heated to 150° C. under pressure, whereby thermal contact bonding of them was effected. The heat-resistant resin was cured by postcuring at 250° C. for 5 minutes, whereby a laminate was fabricated.

As a result of the measurement in accordance with JIS C6471, the laminate so obtained had a peel strength of 1.45 kg/cm. The soldering-heat resistance was also measured in accordance with JIS C6471. As a result, neither blisters nor peeling was recognized until 340° C.

EXAMPLE 5

<Fabrication of a laminate of a metal foil and a heat resistant resin film by using a heat-resistant resin adhesive>

An epoxy resin ("Epicoat 828", trade name; product of Yuka Shell Epoxy Co.) and 4',4-diaminodiphenylsulfone were added to give concentrations of 20 mole % and 5 mole %, respectively, relative to N=C=N bond in the solution composition of the heat-resistant resin adhesive prepared in a similar manner to Example 2, followed by mixing. The mixture so obtained was coated onto an aromatic polyimide film ("Kapton", trade name; product of Du Pont-Toray Co., Ltd., 25 μm thick) by using an applicator. The coated layer was dried under heating at 40° C. for 4 hours in vacuo, whereby a polycarbodiimide resin layer (uncured but dried layer) of about 10 μm thick was formed on the polyimide film. Onto the polyimide film having the resin layer, a rolled copper foil ("BHN-02T", trade name; product of Japan Energy Co., Ltd.) of 35 μm thick was stacked with the resin layer therebetween. They were allowed to pass through laminate rolls heated to 150° C. under pressure, whereby thermal contact bonding of them was effected. The heat-resistant resin was cured by postcuring at 180° C. for 6 minutes, whereby a laminate was fabricated.

As a result of the measurement in accordance with JIS C6471, the laminate so obtained had a peel strength of 1.34 kg/cm. The soldering-heat resistance was also measured in accordance with JIS C6471. As a result, neither blisters nor peeling was recognized until 340° C.

EXAMPLE 6

<Fabrication of a laminate of a metal foil and a heat resistant resin film by using a heat-resistant resin adhesive>

The solution composition of a heat-resistant resin adhesive prepared in a similar manner to Example 2 was coated onto an aromatic polyimide film ("Kapton", trade mark; product of Du Pont-Toray Co., Ltd., 25 μm thick) by using an applicator. The coated layer was dried under heating at 150° C. for 10 minutes, whereby a polycarbodiimide resin layer (uncured but dried layer) of about 1 μm thick was formed on the polyimide film. Onto the polyimide film having the resin layer, a rolled copper foil ("BHN-02T", trade name; product of Japan Energy Co., Ltd.) of 35 μm thick was stacked with the resin layer therebetween. At a temperature of 200° C. and pressure of 30 kg/cm$^2$, they were subjected to thermal contact bonding for 10 minutes by a pressing machine, whereby the heat-resistant resin was cured and a laminate was fabricated.

As a result of the measurement in accordance with JIS C6471, the peel strength of the laminate so obtained was 1.10 kg/cm. The soldering-heat resistance was also measured in accordance with JIS C6471. As a result, neither blisters nor peeling was recognized until 340° C.

From the results of Examples 2 and 3, it has been found that the polycarbodiimide resin has drastically improved heat resistance and strength as a result of the formation of a four-membered ring or six-membered ring through self-crosslinkage between carbodiimide bonds by the heating treatment. It has also been found from Examples 1 to 6 that the preferred temperature for heating treatment is about 40 to 400° C., with 100 to 400° C. being more preferred, and from Example 5 that the heat resistance and strength also showed an improvement even when the polycarbodiimide resin mixed with a general-purpose resin was used as an adhesive. Incidentally, from the fact that the necessary strength is maintained even when the film thickness of the heat-resistant resin adhesive is 1 μm, it has been found that the thickness of the adhesive when dried is preferably 1 μm or greater.

EXAMPLE 7

The solution composition of a heat-resistant resin adhesive prepared in a similar manner to Example 1 was coated onto an aromatic polyimide film ("Kapton", trade mark; product of Du Pont-Toray Co., Ltd., 25 μm thick) by using an applicator. The coated layer was dried under heating at 40° C. for 4 hours in vacuo, whereby a polycarbodiimide resin layer of about 10 μm thick was formed on the polyimide film. Onto the polyimide film having the resin layer, a polyethylene-coated paper was stacked with the resin layer therebetween. They were allowed to pass through laminate rolls heated to 40° C. under pressure, whereby thermal contact bonding of them was effected. As a result, a coverlay film was obtained. After the polyethylene-coated paper was peeled off the coverlay film, onto the coverlay film, a luster side of a rolled copper foil ("BHN-02T", trade name; product of Japan Energy Co., Ltd.) of 35 μm thick was stacked with the adhesive-applied side of therebetween. At a temperature of 180° C. and pressure of 20 kg/cm$^2$, they were subjected to thermal contact bonding for 10 minutes by a pressing machine, whereby a sample to be tested was obtained.

As a result of the measurement in accordance with JIS C6471, the peel strength of the laminate so obtained was 1.16 kg/cm. The soldering-heat resistance was also measured in accordance with JIS C6471. As a result, neither blisters nor peeling was recognized until 320° C.

EXAMPLE 8

The solution composition of a heat-resistant resin adhesive prepared in a similar manner to Example 2 was coated onto an aromatic polyimide film ("Kapton", trade mark; product of Du Pont-Toray Co., Ltd., 25 μm thick) by using an applicator. The coated layer was dried under heating at 40° C. for 4 hours in vacuo, whereby a polycarbodiimide resin layer of about 10 μm thick was formed on the polyimide film. Onto the polyimide film having the resin layer, a polyethylene-coated paper was stacked with the resin layer therebetween. They were allowed to pass through laminate rolls heated to 50° C. under pressure, whereby thermal contact bonding of them was effected. As a result, a coverlay film was obtained. After the polyethylene-coated paper was peeled off the coverlay film, onto the coverlay film, a luster side of a rolled copper foil ("BHN-02T", trade name; product of Japan Energy Co., Ltd.) of 35 μm thick was stacked with the adhesive-applied side of therebetween. At a temperature of 250° C. and pressure of 20 kg/cm$^2$, they were subjected to thermal contact bonding for 5 minutes by a pressing machine, whereby a sample to be tested was obtained.

As a result of the measurement in accordance with JIS C6471, the peel strength of the laminate so obtained was 1.10 kg/cm. The soldering-heat resistance was also measured in accordance with JIS C6471. As a result, neither blisters nor peeling was recognized until 320° C.

EXAMPLE 9

The solution composition of a heat-resistant resin adhesive prepared in a similar manner to Example 2 was coated onto an aromatic polyimide film ("Kapton", trade mark; product of Du Pont-Toray Co., Ltd., 25 μm thick) by using an applicator. The coated layer was dried under heating at 40° C. for 4 hours in vacuo, whereby a polycarbodiimide resin layer of about 10 μm thick was formed on the polyimide film. Onto the polyimide film having the resin layer, a polyethylene-coated paper was stacked with the resin layer therebetween. They were allowed to pass through laminate rolls heated to 40° C. under pressure, whereby thermal contact bonding of them was effected. As a result, a coverlay film was obtained. After the polyethylene-coated paper was peeled off the coverlay film, onto the coverlay film, a luster side of a rolled copper foil ("BHN-02T", trade name; product of Japan Energy Co., Ltd.) of 35 μm thick was stacked with the adhesive-applied side of therebetween. At a temperature of 200° C. and pressure of 20 kg/cm$^2$, they were subjected to thermal contact bonding for 10 minutes by a pressing machine, whereby a sample to be tested was obtained.

As a result of the measurement in accordance with JIS C6471, the peel strength of the laminate so obtained was 1.20 kg/cm. The soldering-heat resistance was also measured in accordance with JIS C6471. As a result, neither blisters nor peeling was recognized until 320° C.

From the result of Examples 7 to 9, it has been found that the coverlay film has drastically improved heat resistance and strength by heating the adhesive containing the polycarbodiimide resin.

We claim:

1. A coverlay film fabricated using a polycarbodiimide resin-containing adhesive having repeating units represented by the following formula:

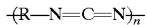

wherein R is a divalent hydrocarbon group and n is an integer of 5 to 250, the resin-containing adhesive having been cured at a temperature between 200° and 400° C.

2. A coverlay film according to claim 1 wherein a release agent and a heat-resistant resin film are adhered with an adhesive containing a polycarbodiimide resin.

3. A process for the fabrication of a coverlay film which comprises a heat-resistant resin film, an adhesive and a release agent according to claim 2, comprising the steps of:

applying the adhesive onto the heat-resistant resin film to form a film-adhesive composite;

drying the adhesive on the film applied at a temperature between 200° to 400° C.; and bonding a release agent onto the dried adhesive.

4. The process of claim 3, wherein the adhesive is dried for a time period from 10 to 120 minutes.

* * * * *